(12) United States Patent
Bicksler

(10) Patent No.: US 8,304,309 B2
(45) Date of Patent: Nov. 6, 2012

(54) SELECT GATES FOR MEMORY

(75) Inventor: Andrew Bicksler, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 484 days.

(21) Appl. No.: 12/613,269

(22) Filed: Nov. 5, 2009

(65) Prior Publication Data

US 2011/0101441 A1    May 5, 2011

(51) Int. Cl.
*H01L 21/336* (2006.01)
(52) U.S. Cl. ............. 438/257; 257/319; 257/E29.3
(58) Field of Classification Search ............ 257/319, 257/E29.3; 438/257
See application file for complete search history.

(56) References Cited

U.S. PATENT DOCUMENTS 6,104,057 A * 8/2000 Nakanishi et al. ............ 257/314
7,348,236 B2 3/2008 Abbott et al.

* cited by examiner

*Primary Examiner* — Zandra Smith
*Assistant Examiner* — Paul Patton
(74) *Attorney, Agent, or Firm* — Leffert Jay & Polglaze, P.A.

(57) ABSTRACT

Methods of forming memory and memory devices are disclosed, such as a memory device having a memory cell with a floating gate formed from a first conductor, a control gate formed from a second conductor, and a dielectric interposed between the floating gate and the control gate. For example, a select gate may be coupled in series with the memory cell and has a first control gate portion formed from the first conductor and a second control gate portion formed from a third conductor. A contact may be formed from the third conductor and coupled in series with the select gate. Other methods and devices are also disclosed.

12 Claims, 10 Drawing Sheets

SELECT GATES FOR MEMORY

FIELD

The present disclosure relates generally to memory devices, and, in particular, the present disclosure relates to select gates for memories.

BACKGROUND

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming (sometimes referred to as writing) of charge storage nodes, such as floating gates, trapping layers, or other physical phenomena, determine the data value of each cell. Common uses for flash memory include personal computers, personal digital assistants (PDAs), digital cameras, digital media players, cellular telephones, and removable memory modules.

A NAND flash memory device is a common type of flash memory device, so called for the logical form in which the basic memory cell configuration is arranged. Typically, the array of memory cells for NAND flash memory devices is arranged such that the control gate of each memory cell of a row of the array is connected together to form an access line, such as a word line. Columns of the array include strings (often termed NAND strings) of memory cells connected together in series, source to drain, between a pair of select lines, a source select line and a drain select line. A "column" refers to a group of memory cells that are commonly coupled to a local data line, such as a local bit line. It does not require any particular orientation or linear relationship, but instead refers to the logical relationship between memory cell and data line.

The source select line includes a source select gate at each intersection between a NAND string and the source select line, and the drain select line includes a drain select gate at each intersection between a NAND string and the drain select line. The select gates are typically field-effect transistors. Each source select gate is connected to a source line, while each drain select gate is connected to a data line, such as column bit line.

The charge storage node for memory cells of some NAND flash memory devices is a conductor, e.g., a floating gate. A dielectric (e.g., sometimes termed an interlayer dielectric) is formed over the floating gate and a control gate is formed over the dielectric. The conductor forming the floating gate is typically of polysilicon. The control gate may also include polysilicon disposed on the interlayer dielectric layer and a conductor, such as metal or metal silicide, disposed on the polysilicon.

Sometimes select gates are formed concurrently with memory cells and thus have the same layers in their gate stacks as the memory cells. For example, a select gate may include a first conductor, corresponding to the floating gates of the memory cells, e.g., of polysilicon, a dielectric, corresponding to the interlayer dielectric of the memory cells, over the first conductor, and a second conductor, corresponding to control gate of the memory cells, e.g., having polysilicon over the dielectric and metal or metal silicide over the polysilicon. However, it is desirable that the select gates and the memory cells operate differently. That is, it is desirable to eliminate the effect of the dielectric between the first and second conductors.

Shorting the polysilicon of the first conductor and the polysilicon of the second conductor together to form a control gate of the select gate is one way to eliminate the effect of the dielectric from a select gate. The first and second conductors may be of different doping types. This will create a p-n junction when the contact is made through the dielectric which acts to increase the select gate resistance.

For the reasons stated above, and for other reasons stated below which will become apparent to those skilled in the art upon reading and understanding the present specification, there is a need in the art for alternative select gates and the methods for their formation.

DETAILED DESCRIPTION

Figure 1:
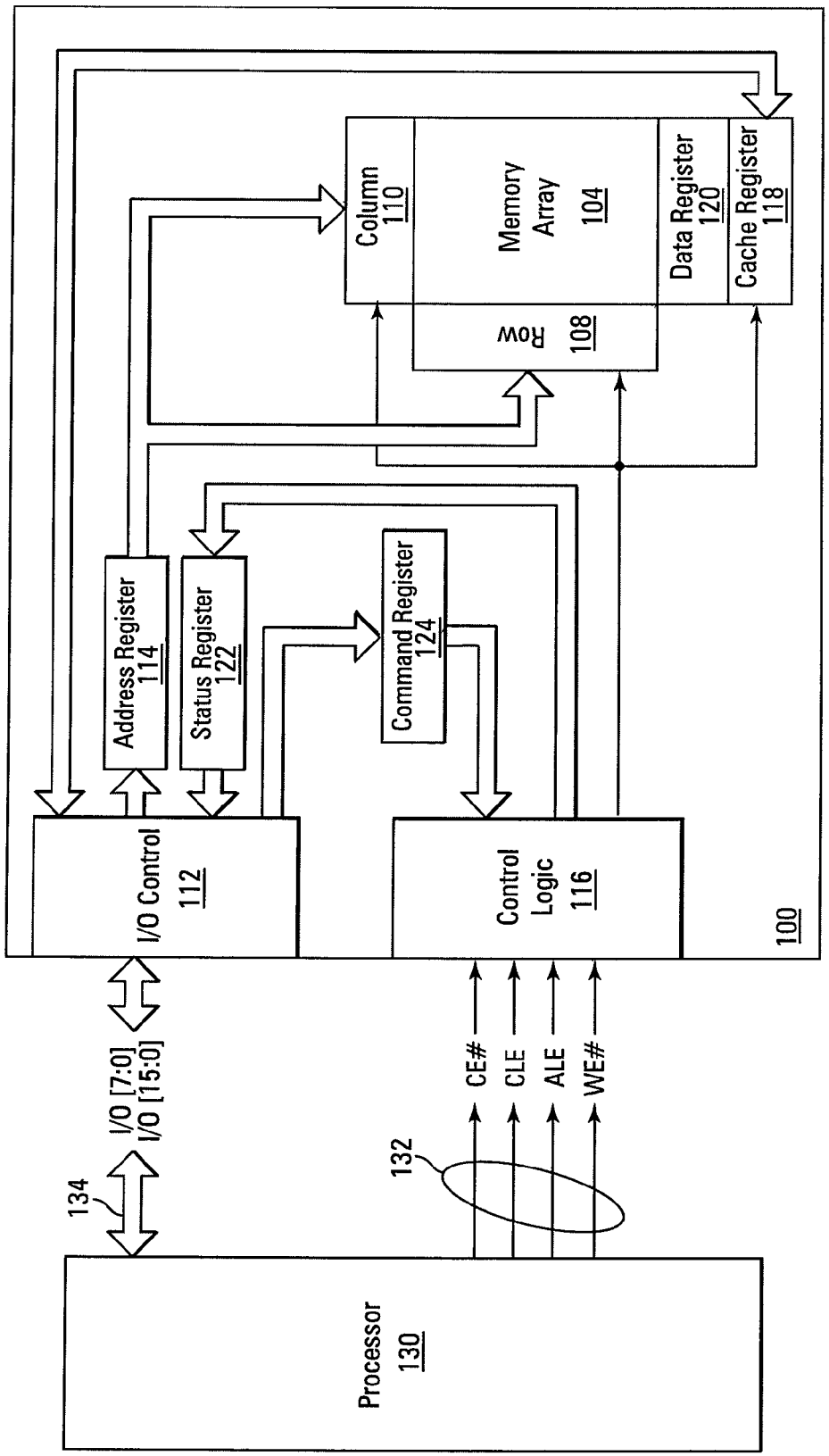
FIG. 1 is a simplified block diagram of a memory system, according to an embodiment.

In the following detailed description, reference is made to the accompanying drawings that form a part hereof, and in which is shown, by way of illustration, specific embodiments. In the drawings, like numerals describe substantially similar components throughout the several views. Other embodiments may be utilized and structural, logical, and electrical changes may be made without departing from the scope of the present disclosure. The term semiconductor can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions. The following detailed description is, therefore, not to be taken in a limiting sense, and the scope of the present disclosure is defined only by the appended claims and equivalents thereof.

FIG. 1 is a simplified block diagram of a NAND flash memory device 100 in communication with a processor 130 as part of an electronic system, according to an embodiment. The processor 130 may be a memory controller or other external host device. Memory device 100 includes an array of memory cells 104 formed in accordance with embodiments of the disclosure. A row decoder 108 and a column decoder 110 are provided to decode address signals. Address signals are received and decoded to access memory array 104. Portions of row decoder 108 and column decoder 110 formed in accordance with embodiments of the disclosure.

Memory device 100 also includes input/output (I/O) control circuitry 112 to manage input of commands, addresses and data to the memory device 100 as well as output of data and status information from the memory device 100. An address register 114 is in communication with I/O control circuitry 112, and row decoder 108 and column decoder 110 to latch the address signals prior to decoding. A command register 124 is in communication with I/O control circuitry 112 and control logic 116 to latch incoming commands. Control logic 116 controls access to the memory array 104 in response to the commands and generates status information for the external processor 130. The control logic 116 is in communication with row decoder 108 and column decoder 110 to control the row decoder 108 and column decoder 110 in response to the addresses.

Control logic 116 is also in communication with a cache register 118. Cache register 118 latches data, either incoming or outgoing, as directed by control logic 116 to temporarily store data while the memory array 104 is busy writing or reading, respectively, other data. During a write operation, data is passed from the cache register 118 to data register 120 for transfer to the memory array 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Memory device 100 receives control signals at control logic 116 from processor 130 over a control link 132. The control signals may include at least a chip enable CE#, a command latch enable CLE, an address latch enable ALE, and a write enable WE#. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming memory array 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2:
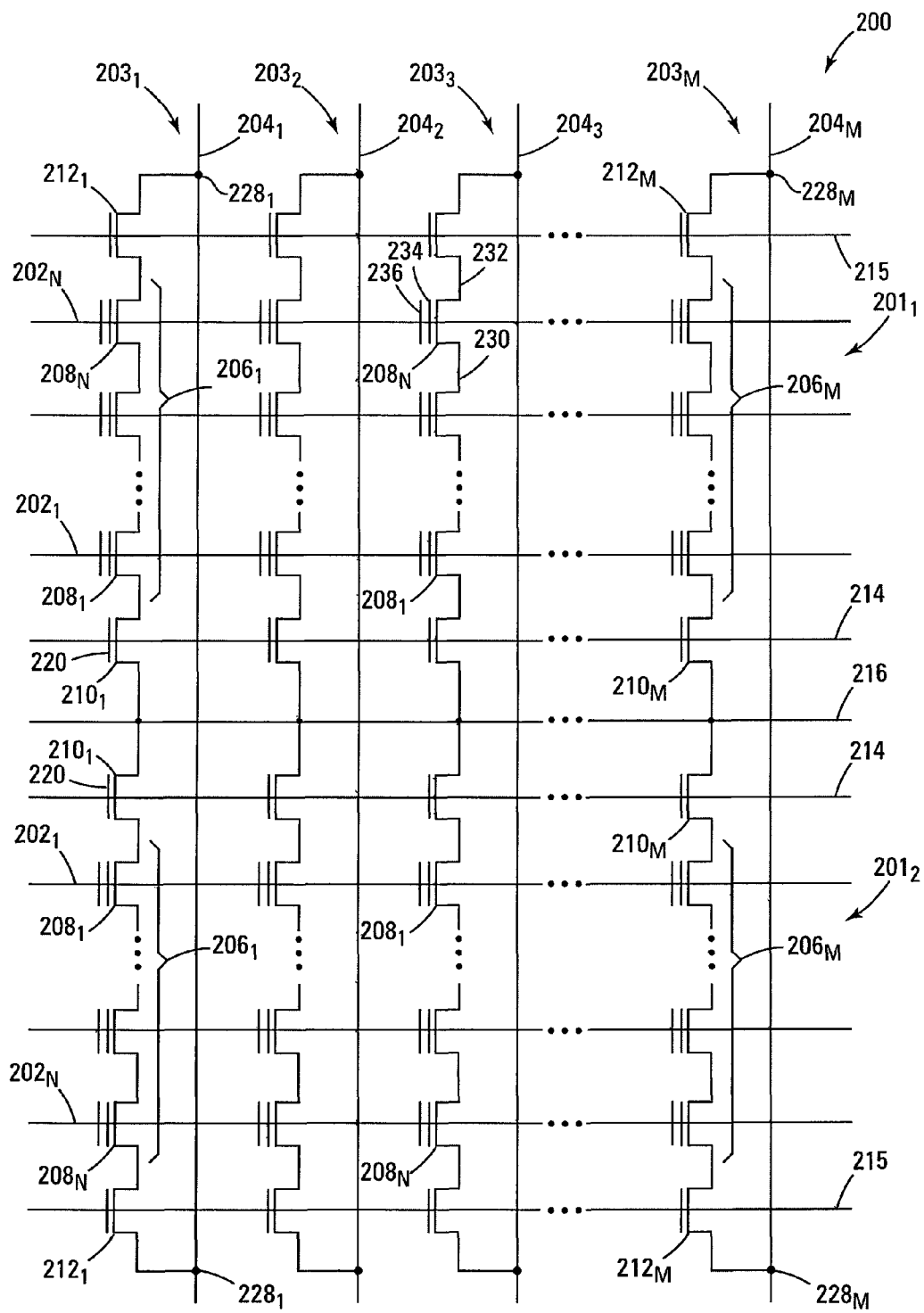
FIG. 2 is a schematic of a NAND memory array, according to another embodiment.

FIG. 2 is a schematic of a NAND memory array 200 as a portion of memory array 104 in accordance with another embodiment. As shown in FIG. 2, NAND memory array 200 may include two separate NAND arrays $201_1$ and $201_2$ formed as mirror images of each other on either side of and coupled to a common source line 216 so that NAND arrays $201_1$ and $201_2$ share common source line 216, as is known in the art.

Each memory array 201 includes access lines, such as word lines $202_1$ to $202_N$, and intersecting local data lines, such as local bit lines $204_1$ to $204_M$. For ease of addressing in the digital environment, the number of word lines 202 and the number of bit lines 204 are each some power of two, e.g., 256 word lines 202 by 4,096 bit lines 204. The local bit lines 204 are coupled to global bit lines (not shown) in a many-to-one relationship.

Memory array 200 is arranged in rows (each corresponding to a word line 202) and columns 203 (columns $203_1$ to $203_M$). Each column 203 includes a string, such as NAND strings $206_1$ to $206_M$ formed as mirror images on either side of common source line 216. Each NAND string 206 on either side of common source line 216 is coupled to common source line 216 and includes floating gate transistors $208_1$ to $208_N$, each located at an intersection of a word line 202 and a local bit line 204. The floating gate transistors 208 represent non-volatile memory cells for storage of data. The floating gate transistors 208 of each NAND string 206 are connected in series, source to drain, between a source select gate 210, e.g., a field effect transistor (FET), and a drain select gate 212, e.g., an FET.

A source of each source select gate 210 is connected to common source line 216 and thus selectively couples its respective NAND string 206 to common source line 216. The drain of each source select gate 210 is connected to the source of the first floating gate transistor 208 of the corresponding NAND string 206. For example, the drain of each source select gate $210_1$ is connected to the source of floating gate transistor $208_1$ of the corresponding NAND string $206_1$. A control gate 220 of each source select gate 210 is connected to source select line 214.

The drain of each drain select gate 212 is connected to the local bit line 204 for the corresponding NAND string at a drain contact 228. For example, the drain of each drain select gate $212_1$ is connected to the local bit line $204_1$ for the corresponding NAND string $206_1$ at drain contact $228_1$. The source of each drain select gate 212 is connected to the drain of the last floating gate transistor $208_N$ of the corresponding NAND string 206. For example, the source of each drain select gate $212_1$ is connected to the drain of floating gate transistor $208_N$ of the corresponding NAND string $206_1$.

Note that the drain select gate 212 of a column 203 on the either side of common source line 216 selectively couples its respective NAND string 206 to the same bit line 204. For example, drain select gate $212_1$ of column $203_1$ of array $201_1$ and drain select gate $212_1$ of column $203_1$ of array $201_2$ respectively selectively couple NAND string $206_1$ of column $203_1$ of array $201_1$ and NAND string $206_1$ of column $203_1$ of array $201_2$ to bit line $204_1$, as shown in FIG. 2.

Typical construction of floating gate transistors 208 includes a source 230 and a drain 232, a floating gate 234, and a control gate 236, as shown in FIG. 2. Floating gate transistors 208 have their control gates 236 coupled to (and in some cases from) a word line 202. A column 203 of the floating gate transistors 208 is a NAND string 206 on either side of source line 216 coupled to a given local bit line 204. A row of the floating gate transistors 208 are those transistors commonly coupled to a given word line 202.

Figure 3:
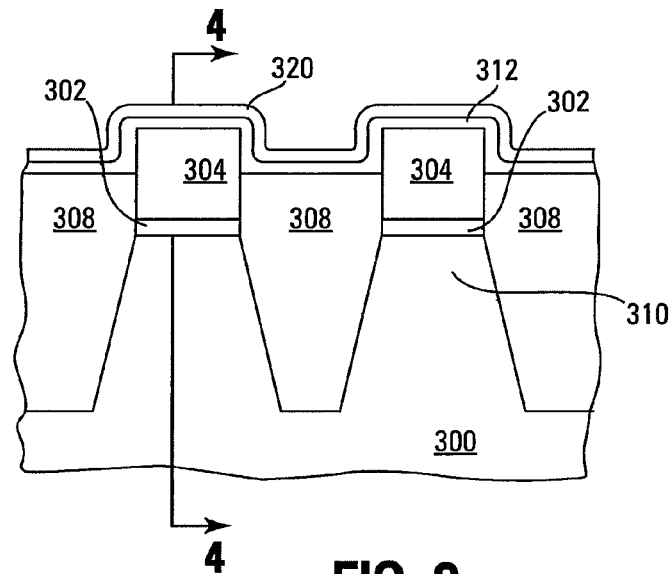
FIG. 3 is a cross-sectional view at a stage of fabrication, according to another embodiment.

FIGS. 3 and 4A-4G are cross-sectional views of a portion of a memory device, such as memory device 100, including a portion of a memory array, such as a portion of the memory array 200 of FIG. 2, during various stages of fabrication, according to another embodiment. FIG. 3 is a cross-sectional view taken along a row direction, e.g., corresponding to a word line 202 (FIG. 2) and FIGS. 4A-4G are cross-sectional views taken along line 4-4 of FIG. 3 and are taken along a column direction, such as a column 203 (FIG. 2).

FIGS. 4A-4G illustrate an array portion, where array devices, e.g., an array of memory cells and source and drain select gates, such as of memory array 104 of FIG. 1 and memory array 200 of FIG. 2, will be formed. FIGS. 4A-4G further illustrate a periphery, such as of memory device 100, where various periphery devices, e.g., integrated circuit elements, including passive elements, such as capacitors, and active elements, such as transistors, will be formed. The active elements may form a portion of row access circuitry 108 and/or column access circuitry 110 of memory device 100. For one embodiment, the active elements include field-effect transistors.

Figure 4A:
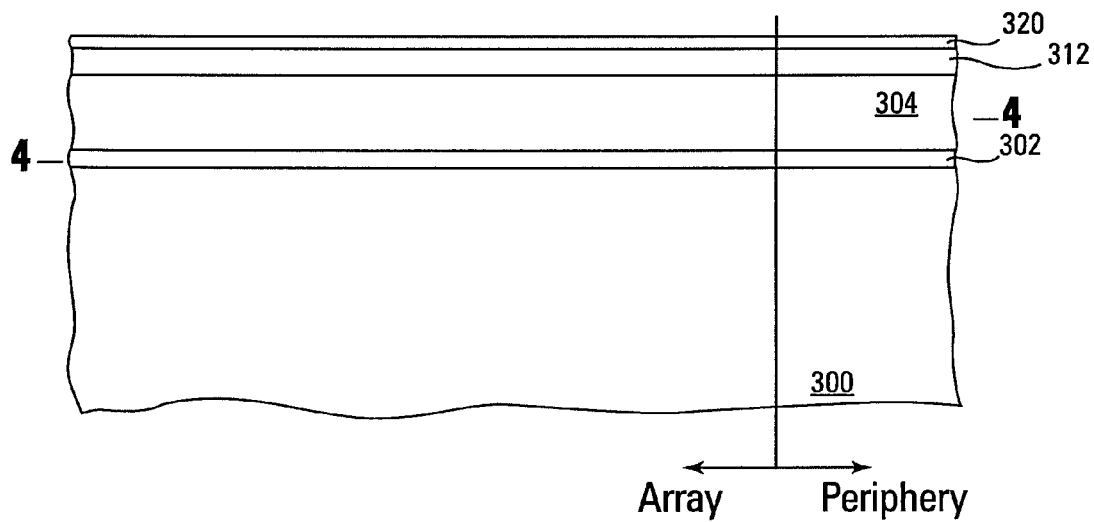
FIGS. 4A-4G are cross-sectional views taken along line 4-4 of FIG. 3 during various stages of fabrication, according to another embodiment.

FIGS. 3 and 4A correspond to the same stage of processing after several processing steps have occurred. Formation of the structure depicted in FIGS. 3 and 4A is well known and will not be detailed herein.

In general, for one embodiment, the structures of FIGS. 3 and 4A are formed by forming a dielectric 302, e.g., an oxide, over a semiconductor 300, such as monocrystalline silicon wafer or the like. A conductor 304, such as doped polysilicon, is formed over dielectric 302. A hard mask (not shown), such as a nitride, e.g., a silicon nitride ($Si_3N_4$), may be formed over conductor 304.

Isolation regions 308, such as shallow trench isolation (STI) regions, are then formed by patterning the hard mask and etching trenches through the hard mask, conductor 304, and dielectric 302 and into semiconductor 300. This defines active regions 310 under dielectric 302, as shown in FIG. 3. A suitable dielectric material, such as an oxide, e.g., a thermal oxide and/or a high-density-plasma (HDP) oxide, a spin-on dielectric material, e.g., hydrogen silsesquioxane (HSQ), hexamethyldisiloxane, octamethyltrisiloxane, etc., is deposited in the trenches and possibly over the hard mask, such as by blanket deposition, to form isolation regions 308 between the active regions 310. The dielectric material is then removed from the hard mask, and the hard mask is removed, exposing an upper surface of conductor 304 of each of the active regions 310. The isolation regions 308 may be recessed so that their upper surfaces lie below the upper surface of conductor 304 of each of the active regions 310, e.g., by etching.

A dielectric 312 is formed over isolation regions 308 and conductor 304. Dielectric 312 can be silicon oxide, nitride, oxynitride, oxide-nitride-oxide (ONO), or other dielectric material. A protective material, such as protective layer 320, e.g., of doped or undoped polysilicon, silicon nitride, etc., may be formed over dielectric 312. Protective layer 320 can be used to protect dielectric 312 during subsequent processing, as indicated below.

Figure 4B:
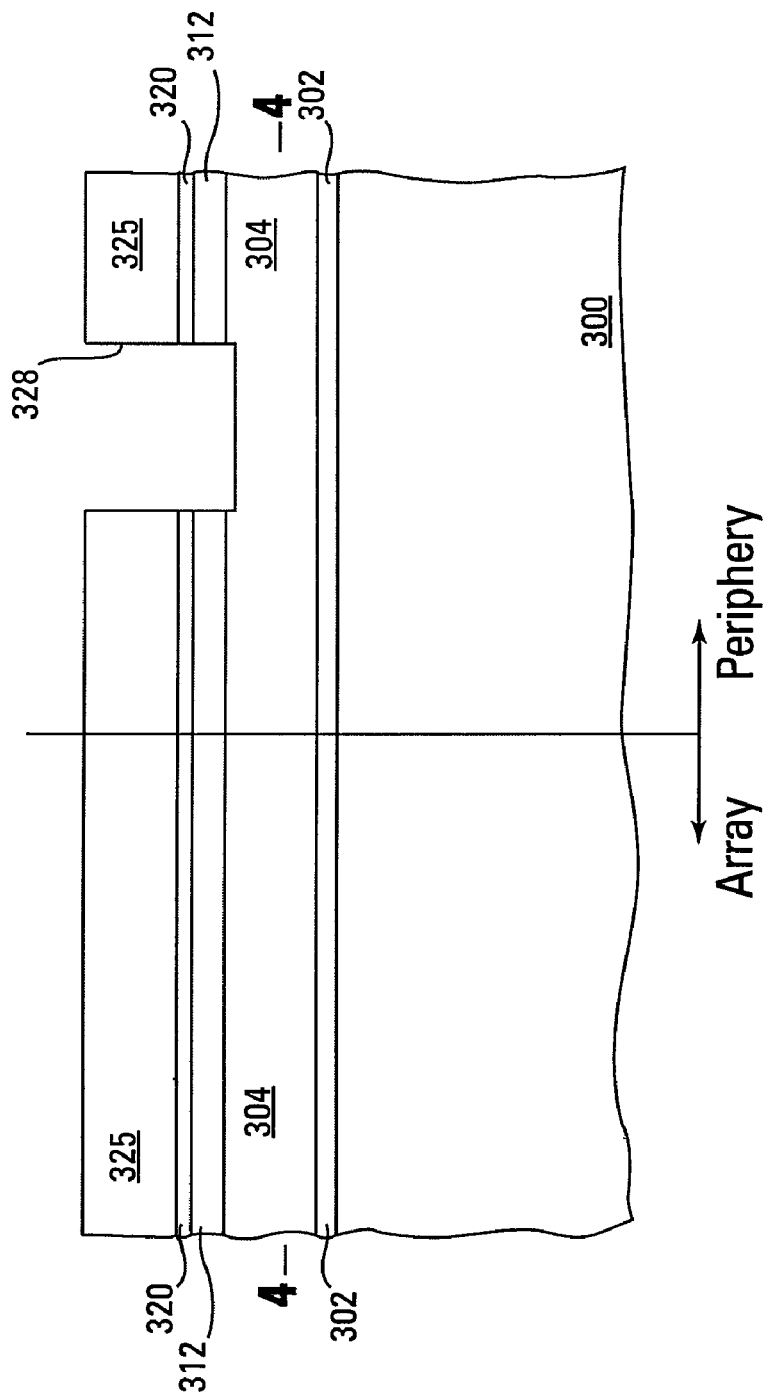

A mask 325 is formed over protective layer 320 in FIG. 4B and is patterned for exposing a portion of protective layer 320 and a portion of the underlying dielectric 312 within the periphery for removal. As one example, mask 325 is a patterned photoresist as is commonly used in semiconductor fabrication. The exposed portion of protective layer 320 and of the underlying dielectric 312 are then removed in FIG. 4B, such as by etching, stopping on or within conductor 304, thereby exposing a portion of conductor 304. The removal process forms an opening 328 (e.g., a slot) through protective layer 320 and dielectric 312 that exposes a portion of conductor 304 in FIG. 4B. For at least one embodiment, the formation of opening 328 and can be omitted.

Mask 325 is removed from the structure of FIG. 4B. For one embodiment, protective layer 320 acts to protect dielectric 312 during the removal of mask 325. A conductor 327 is formed over protective layer 320 so that a portion of conductor 327 fills opening 328 to form a contact 330 that passes through protective layer 320 and dielectric 312 and, for example, that directly, physically contacts the exposed portion of conductor 304, as shown in FIG. 4C.

Contact 330 electrically connects conductor 327 to conductor 304. Electrically connected conductor 327 and conductor 304 form a control gate of a transistor, such as a field-effect transistor (FET), on the periphery, and dielectric 302 forms a gate dielectric (e.g., a gate oxide) of that transistor.

Figure 4C:
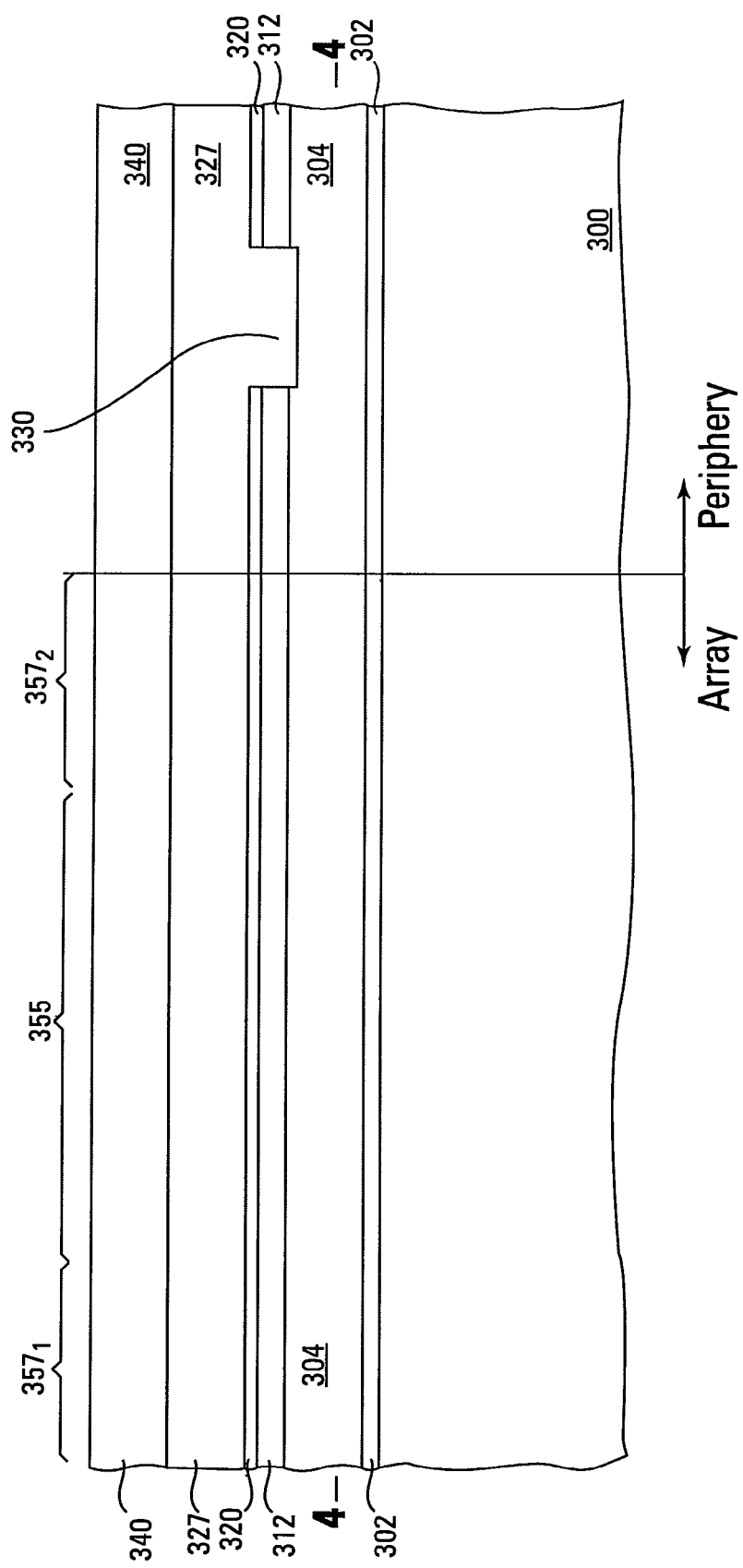

A protective material, such as a protective layer 340, e.g., of oxide, TEOS (tetraethylorthosilicate), nitride, etc., may be formed over conductor 327, as shown in FIG. 4C. Note that for at least one embodiment where the formation of opening 328 is omitted, conductor 327 and protective layer 340 are formed directly on the structure of 4A.

Conductor 327 may comprise, consist of, or consist essentially of conductively doped polysilicon and/or may comprise, consist of, or consist essentially of metal, such as a refractory metal, or a metal-containing material, such as a refractory metal silicide layer, as well as any other conductive material. The metals of chromium (Cr), cobalt (Co), hafnium (Hf), molybdenum (Mo), niobium (Nb), tantalum (Ta), titanium (Ti), tungsten (W), vanadium (V) and zirconium (Zr) are generally recognized as refractory metals.

Note that the array includes a source-select-gate portion 355 in which source select gates and a source line will be formed and memory-cell portions $357_1$ and $357_2$ in which memory cells will be formed (FIG. 4C). For example, strings (e.g., NAND strings) of series-coupled memory cells may be formed in memory-cell portions $357_1$ and $357_2$. The strings of memory cells formed in memory-cell portions $357_1$ and $357_2$ may then be respectively coupled in series to source select gates formed in source-select-gate portion 355 that may be coupled in series with the source line.

Figure 4D:
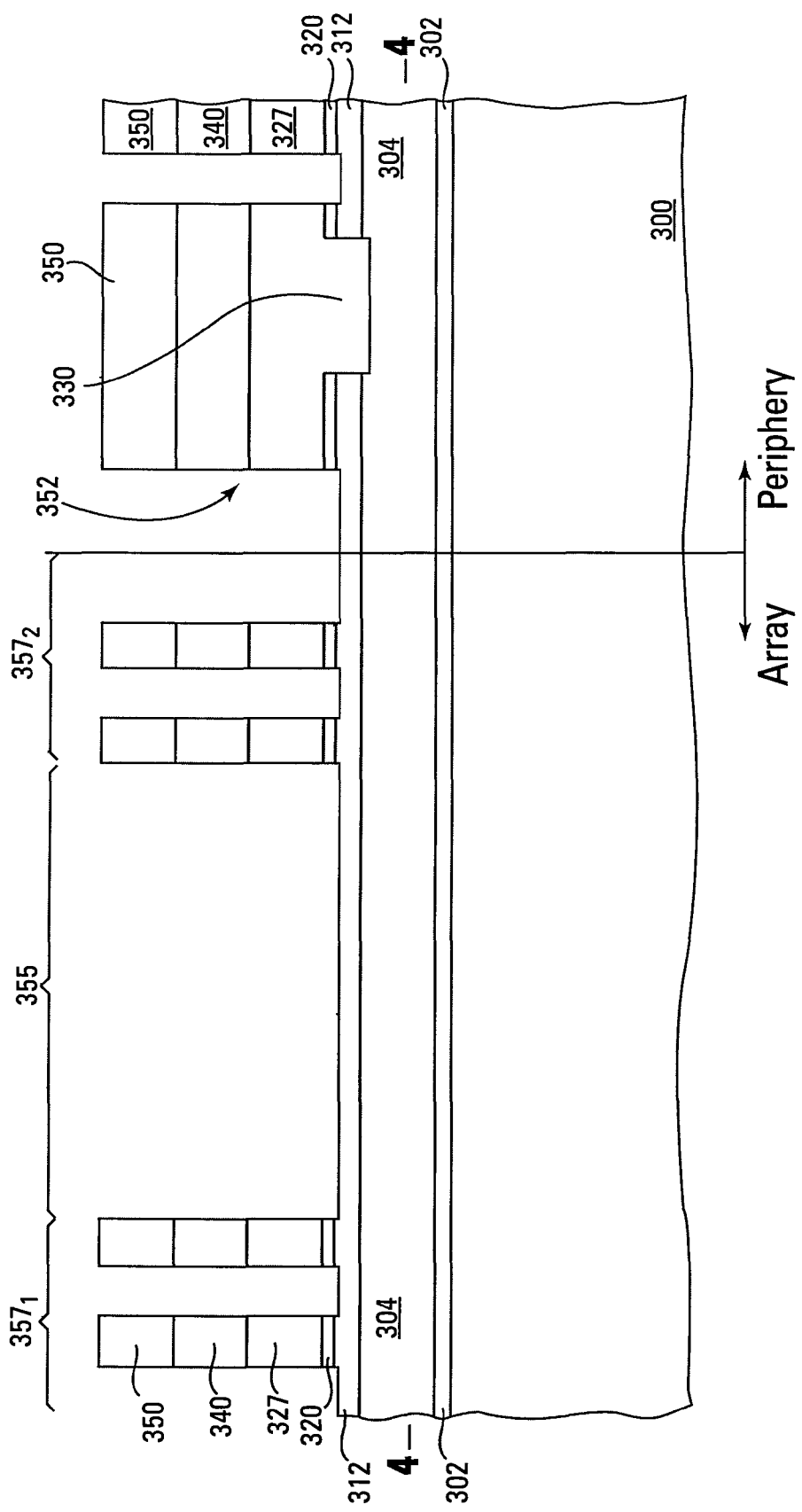

A mask 350, e.g., of photoresist, is formed on protective layer 340 in FIG. 4D and is patterned for exposing portions of protective layer 340, the underlying conductor 327, and the underlying protective layer 320 within the periphery and within memory-cell portions 357 and source-select-gate portion 355 of the array for removal, as shown in FIG. 4D. The exposed portions of protective layer 340, the underlying conductor 327, and the underlying protective layer 320 are then removed in FIG. 4D, such as by etching, stopping on or within dielectric 312, thereby exposing portions of dielectric 312.

The removal process in FIG. 4D may remove protective layer 340, the underlying conductor 327, and the underlying protective layer 320 from the entire source-select-gate portion 355 so that the entirety of source-select-gate portion 355 and the select gates formed therein, may be devoid of protective layer 340, the underlying conductor 327, and the underlying protective layer 320, as shown in FIG. 4D. The removal process further forms portions of memory cells in each of memory-cell portions $357_1$ and $357_2$. For example, conductor 327 forms a control gate of the memory cells in each of memory-cell portions $357_1$ and $357_2$.

For at least one embodiment, where contact 330 is omitted, mask layer 350 is patterned on the periphery for exposing portions of protective layer 340, the underlying conductor 327, and the underlying protective layer 320 of the structure 352, without contact 330, for removal. The exposed portions of protective layer 340, the underlying conductor 327, and the underlying protective layer 320 of structure 352, without contact 330, are then removed, e.g., substantially concurrently, with exposed portions of protective layer 340, the underlying conductor 327, and the underlying protective layer 320 in the array, such as by etching, stopping on or within dielectric 312. This removes structure 352, without contact 330, to dielectric 312, thereby exposing dielectric 312.

Figure 4E:
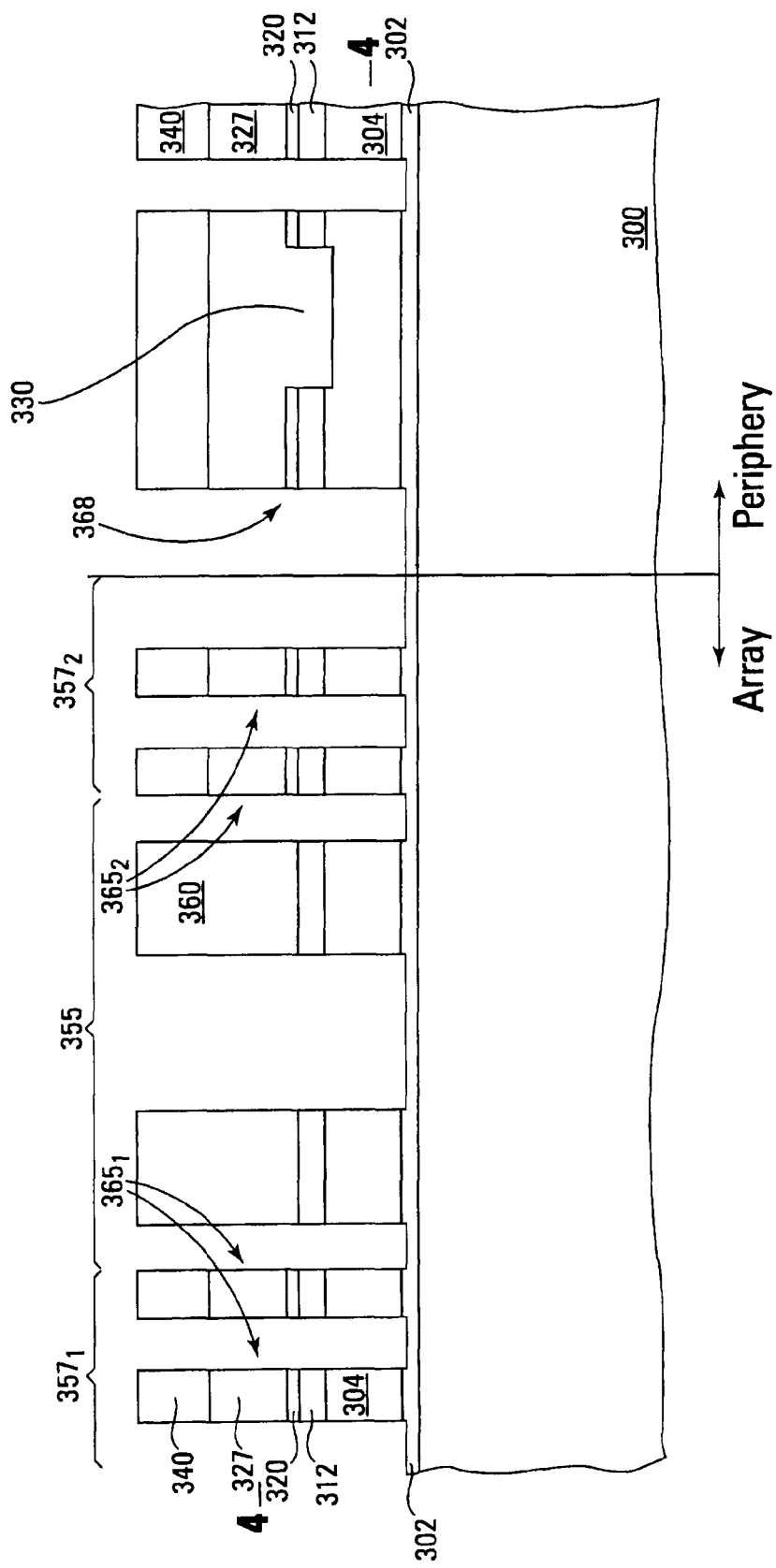

Mask 350 is removed, and a mask 360, e.g., of photoresist, is formed over source-select-gate portion 355 in FIG. 4E. Mask 360 is patterned to expose portions of dielectric 312 and the underlying conductor 304 within source-select-gate portion 355 for removal. The exposed portions of dielectric 312 and the underlying conductor 304 within source-select-gate portion 355 are then removed in FIG. 4E, such as by etching, stopping on or within dielectric 302, thereby exposing portions of dielectric 302. The remaining portion of conductor 304 and dielectric 302 within the source-select-gate portion 355 respectively forms a portion of a control gate and a gate dielectric of the source select gates within the source-select-gate portion 355.

The removal process in FIG. 4E also removes exposed portions (portions that are not covered by protective layer 340) of dielectric 312 and the underlying conductor 304 within memory-cell portions 357 and within the periphery, stopping on or within dielectric 302. That is, protective layer 340 acts as a mask within memory-cell portions 357 and within the periphery, preventing the underlying dielectric 312 and the underlying conductor 304 from being removed. The remaining portions of dielectric 312, conductor 304, and dielectric 302 within memory-cell portions 357 respectively form an intergate dielectric, a floating gate, and a tunnel dielectric of the memory cells within memory-cell portions 357. Note that the removal of dielectric 312 and the underlying conductor 304 within memory-cell portions 357 and within the periphery may occur substantially currently with the removal of dielectric 312 and the underlying conductor 304 within source-select-gate portion 355.

The patterning and removal in FIG. 4E forms, e.g., substantially concurrently, floating-gate memory cells 365 (e.g., floating-gate memory cells $365_1$ and $365_2$) in memory-cell portions 357, a field-effect transistor 368 in the periphery, and a portion of source select gates $370_1$ and $370_2$, e.g., field-effect transistors, in source-select-gate portion 355. Each floating-gate memory cell 365 includes the dielectric 302 formed over the substrate 300 as the tunnel dielectric (tunnel oxide), the conductor 304 formed over the dielectric 302 as the floating gate, the dielectric 312 formed over the conductor 304 as the intergate dielectric, and the conductor 327 formed over the dielectric 312 as the control gate (e.g., a portion of a word line). As such, conductor 304 may be alternatively referred to as a floating gate 304.

Field-effect transistor 368 includes the dielectric 302 formed over the substrate 300 as a gate dielectric (gate oxide). Conductor 304 formed over the dielectric 302 and the conductor 327 formed over the dielectric 312, including contact 330 connected between conductors 304 and 327 and passing through protective layer 320 and dielectric 312, forms a control gate of field effect transistor 368. Each select gate 370 includes dielectric 302 as the gate dielectric (e.g., gate oxide) and conductor (e.g., floating-gate) 304 that forms the portion of the control gate of the respective select gate 370.

For some embodiments, conductor 304 may comprise, consist of, or consist essentially of polysilicon having a first conductivity type to enhance memory cell performance when forming a floating gate of the memory cells 365. This means that the portion of conductor 304 that forms a portion of the control gate of field effect transistor 368 is also of polysilicon having the first conductivity type. For some of these embodiments, conductor 327 may comprise, consist of, or consist essentially of polysilicon having a second conductivity type, different than the first conductivity type, when forming the control gate of the memory cells 365 to enhance the electrical conductivity of the control gate of memory cells 365. This means that the portion of conductor 327 that forms the other portion of the control gate, and thus contact 330, of field effect transistor 368 also comprises, consists of, or consists essentially of polysilicon having the second conductivity type. This produces a p-n junction where contact 330 contacts conductor 304 that can increase the resistance of the control gate of field effect transistor 368, and thus of field effect transistor 368. Therefore, for other embodiments, the portion of conductor 304 that forms the portion of the control gate of field effect transistor 368 may be counter doped to polysilicon having the second conductivity type during its formation, while keeping the portion of conductor 304 that forms the floating gates of memory cells 365 as polysilicon having the first conductivity type. The portion of conductor 304 that forms portions of the control gates of select gates 370 may be counter doped substantially concurrently with counter doping the conductor 304 of transistor 368. Alternatively, conductor 304 of select gates 370 may be left as polysilicon having the first conductivity type.

For at least one embodiment where formation of opening 328 and the formation of contact 330 are omitted and the structure 352, without contact 330, of FIG. 4D in the periphery is removed to dielectric 312, mask 360 may also be formed on dielectric 312 and patterned for exposing portions of dielectric 312 and the underlying conductor 304 on the periphery for removal. The exposed portions of dielectric 312 and the underlying conductor 304 in the periphery are then removed, e.g., substantially concurrently with exposed portions of dielectric 312 and the underlying conductor 304 in the array, such as by etching, stopping on or within dielectric 302. This forms a field-effect transistor 568 (FIG. 5) in the periphery in place of field-effect transistor 368 having a structure that is substantially the same as select gates 370, e.g., having dielectric 302 that acts as a gate dielectric (e.g., gate oxide) and conductor (e.g., floating-gate) 304 that forms a portion of a control gate of field-effect transistor 568.

Figure 4F:
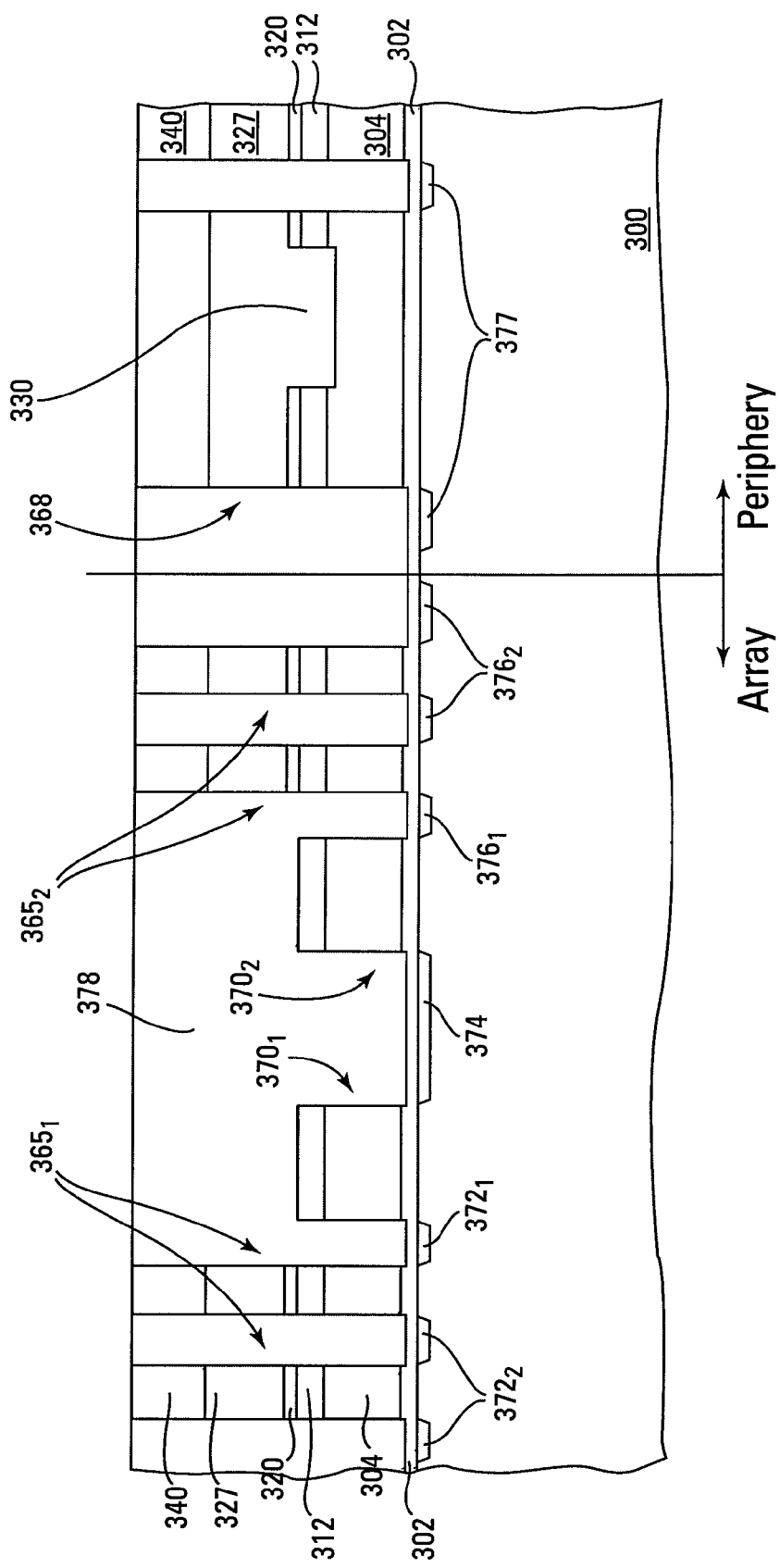

Mask 360 is removed and source/drain regions 372, 374, 376, and 377 are formed in semiconductor 300 in FIG. 4F. Source/drain regions $372_2$ and $376_2$ respectively connect floating-gate memory cells $365_1$ and floating-gate memory cells $365_2$ in series to form portions of NAND strings. Source/drain regions $372_1$ and $376_1$ respectively connect source select gates $370_1$ and $370_2$ in series with series-connected floating-gate memory cells $365_1$ and series-connected floating-gate memory cells $365_2$ and thus the respective NAND strings.

In FIG. 4F, dielectric 378, e.g., bulk insulation, is formed over the source/drain regions and the structure resulting from the removal process in FIG. 4E. Excess portions of dielectric 378 may be removed, e.g., by chemical mechanical planerization (CMP), stopping on protective layer 340, so that an upper surface of dielectric 378 is substantially flush with upper surfaces of protective layer 340. One example for dielectric 378 would be a doped silicate glass. Examples of doped silicate glasses include BSG (borosilicate glass), PSG (phosphosilicate glass), and BPSG (borophosphosilicate glass). Another example for dielectric 378 would be TEOS (tetraethylorthosilicate).

Figure 4G:
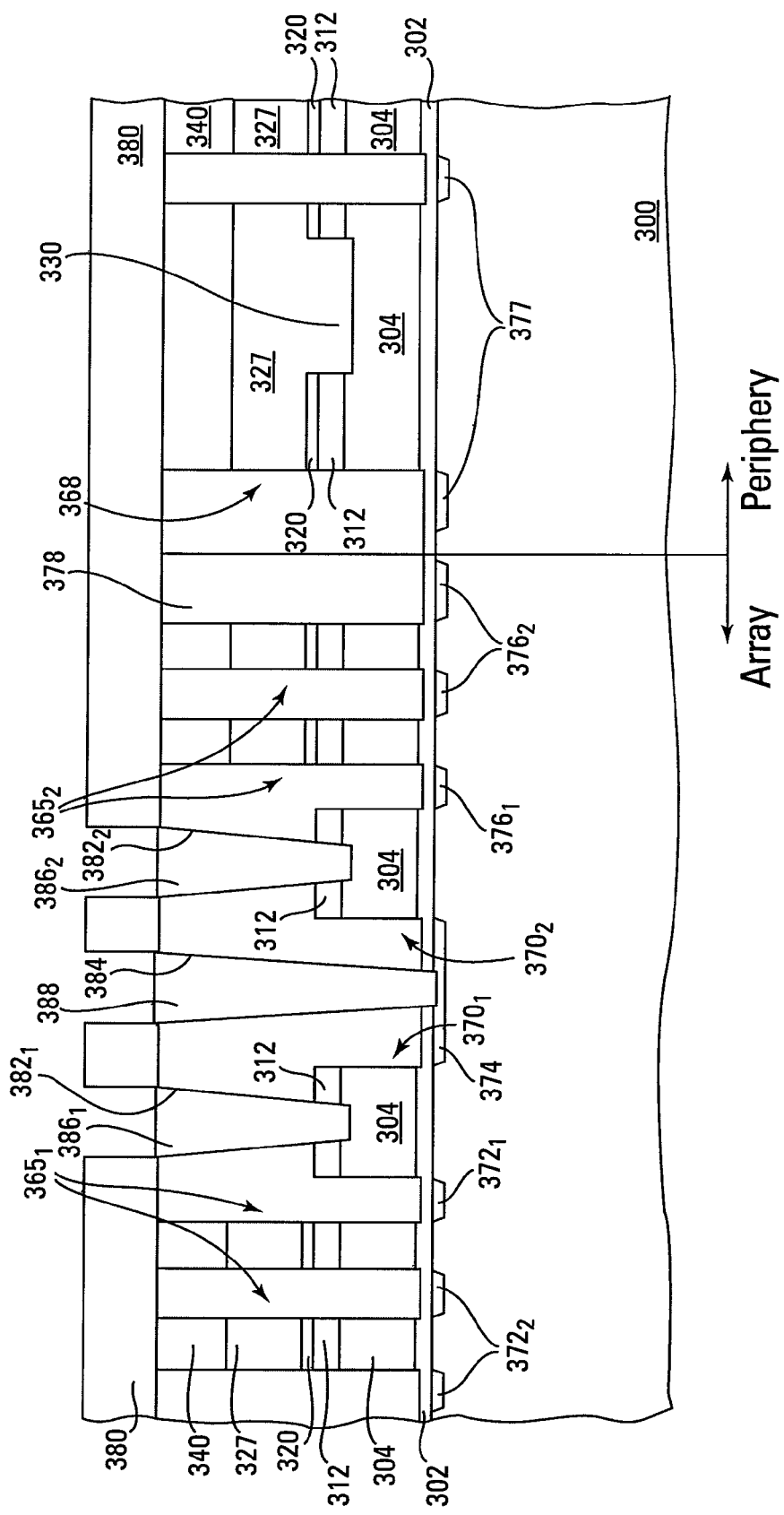

A mask 380, e.g., of photoresist, is formed over the array and periphery, i.e., over dielectric 378 and protective layer 340, in FIG. 4G, and is patterned to expose portions of dielectric 378 within the array for removal. In particular, mask 380 is patterned to expose portions of dielectric 378 and the underlying dielectric 312 directly over select gates 370 for removal. Mask 380 is also patterned to expose portions dielectric 378 directly over source/drain region 374 for removal. The exposed portions of dielectric 378 and the underlying dielectric 312 directly over select gates 370 are removed in FIG. 4G, such as by etching, stopping on or within conductor 304 to form contact openings $382_1$ and $382_2$. The exposed portions of dielectric 378 directly over source/drain region 374 are removed, such as by etching, stopping on or within source/drain region 374, and thus substrate 300, to form contact opening 384. For one embodiment, openings $382_1$, $382_2$, and 384 may be formed substantially concurrently, e.g., using an etch that is selective over polysilicon.

Mask 380 is removed, and contacts $386_1$, $386_2$, and 384 are respectively formed in openings $382_1$, $382_2$, and 384 substantially concurrently, e.g., so that contacts $386_1$, $386_2$, and 388 are respectively in direct physical contact with conductor 304 of source select gate $370_1$, conductor 304 of source select gate $370_2$, and source/drain region 374. For example, contacts $386_1$, $386_2$, and 388 may be formed by overfilling openings $382_1$, $382_2$, and 384 with the same conductor, e.g., using chemical vapor deposition (CVD) or physical vapor deposition (PVD) techniques. Subsequently, a portion of the conductor is removed, e.g., by chemical mechanical planerization (CMP), and a remaining portion of the conductor forms contacts $386_1$, $386_2$, and 388.

The conductor of contacts $386_1$, $386_2$, and 388 may comprise, consist of, or consist essentially of a metal or metal-containing layer and may be aluminum, copper, a refractory metal, or a refractory metal silicide layer. In some embodiments, the conductor may contain multiple metal-containing layers, e.g., a titanium nitride (TiN) barrier layer formed over (e.g., in direct physical contact with) conductor 304 of source select gates 370 and source/drain region 374, a titanium (Ti) adhesion layer formed over the barrier layer, and a tungsten (W) layer formed over the adhesion layer.

Contacts $386_1$ and $386_2$ respectively form another portion of the control gates of source select gates $370_1$ and $370_2$. As such, the control gate of each source select gate 370 includes conductor 304 and a contact 386 in contact with conductor 304. Contact 388 forms a common source line selectively coupled to the NAND strings including memory cells $365_1$ and $356_2$ by source select gates $370_1$ and $370_2$, respectively. Source/drain region 374 connects source select gates $370_1$ and $370_2$ in series with the common source line formed by contact 388.

Figure 5:
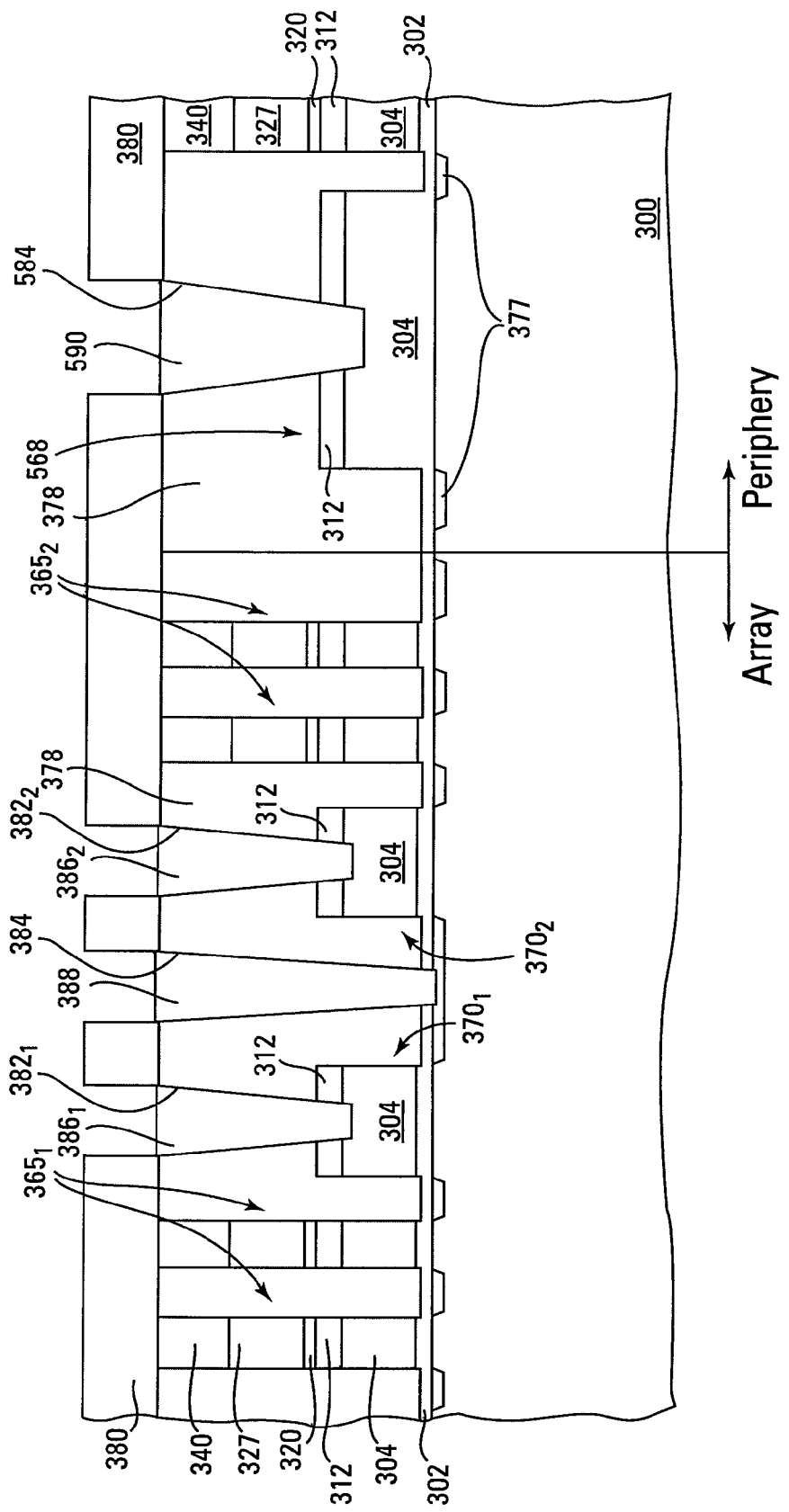
FIG. 5 is a cross-sectional view of a portion of a memory device, according to another embodiment.

For the embodiment, where contact 330 is omitted, mask 380 is patterned over the array and the periphery, as shown in FIG. 5. The patterning over the array is as described above and shown in FIG. 4G. Mask 380 is patterned over the periphery to expose a portion of dielectric 378 and the underlying dielectric 312 of field-effect transistor 568 for removal. The exposed portions of dielectric 378 and the underlying dielectric 312 are then removed, e.g., substantially concurrently in the array and periphery, in FIG. 5, such as by etching, stopping on or within conductor 304 to form a contact opening 584 and contact openings $382_1$ and $382_2$ and stopping on or within source/drain region 374 (substrate 300) to form a contact opening 384.

A contact 590 is then formed in contact opening 584, e.g., using the same conductor and methods for forming contacts $386_1$, $386_2$, and 388, as described above in conjunction with FIG. 4G. Note that contacts $386_1$, $386_2$, and 388 may be formed substantially concurrently with contact 590, and thus field-effect transistor 568 and select gates 370 may be formed substantially concurrently.

Field-effect transistor 568 includes the dielectric 302 formed over the substrate 300 as a gate dielectric (gate oxide). Conductor 304 formed over the dielectric 302 and the contact 590 connected to conductor 304 forms the control gate of field-effect transistor 568. Note that conductor 590 of the control gate of field-effect transistor 568 replaces the portion of the control gate of field-effect transistor 368 (FIG. 4G) that includes conductor 327 and contact 330. This acts to reduce the electrical resistance of the control gate. Moreover, replacing conductor 327 and contact 330 with contact 590 eliminates the p-n junction that can form in the event that conductor 327 and contact 330 are of polysilicon having the second conductivity type and conductor 304 is of polysilicon having the first conductivity type and eliminates the desire to counter dope conductor 304.

Control gates of some conventional select gates sometimes have substantially the same structure as the control gate of field-effect transistor 368 (FIG. 4G). For example, the control gate of some conventional select gates may have a first portion, e.g., a portion having polysilicon of the first conductivity type, that corresponds to the floating gates of memory cells that are formed substantially concurrently with the select gates. The conventional select gates may also have a second portion, e.g., a portion having polysilicon of the second conductivity type, having a contact that contacts first portion, where the second portion, including the contact, corresponds to the control gate of the substantially concurrently formed memory cells. Contacts 386 (FIG. 4G) replace the second portions of the control gates of the conventional select gates and can reduce the resistance of the control gates. Moreover, replacing second portion of the control gate with a contact 386 eliminates the p-n junction that can form in the event that the second portion is of polysilicon having the second conductivity type and the first portion is of polysilicon having the first conductivity type and eliminates the desire to counter dope the polysilicon having the first conductivity type.

Note that drain select gates are connected in series with the NAND strings respectively including memory cells $365_1$ and $365_2$ by source/drain regions (not shown) formed in semiconductor 300. For one embodiment, the drain select gates have the same, e.g., substantially the same, structure as source select gates 370 of FIGS. 4G and 5 and are formed using the methods described above for forming source select gates 370. That is, the drain select gates may be formed substantially concurrently with memory cells 365, source select gates 370, and transistor 368 or transistor 568 and may include dielectric 302 as a gate dielectric (e.g., gate oxide) and a control gate that includes conductor 304 and a contact (e.g., similar to and of the same material as contact 386) in contact with conductor 304 and passing through dielectric 312. Source/drain regions connect the drain select gates to bit line contacts (not shown) formed in contact openings (not shown) formed in dielectric 378, e.g., substantially concurrently with forming contacts $386_1$, $386_2$, and 388 and contact 590, when applicable. The bit line contacts may be formed using the same conductor and methods used for forming contacts $386_1$, $386_2$, and 388, as described above in conjunction with FIGS. 4G and 5.

A dielectric (not shown), e.g., silicon oxide, TEOS, silicon nitride, or silicon oxynitride, may formed over the structure of FIG. 4G or the structure of FIG. 5. Contacts (e.g., via plugs)

may then formed through the dielectric layer in contact with the bit line contacts, contacts $386_1$ and $386_2$, and contact 388 (or contact 590 when applicable). The via plugs may be formed using the substantially the same conductor and methods used for forming contacts $386_1$, $386_2$, and 388.

A conductor (not shown) that may be metal, such as aluminum, is formed on the dielectric formed over the structure of FIG. 4G or the structure of FIG. 5 in electrical contact with via plugs. The conductor is patterned, etched, and processed, e.g., using standard processing, to produce individual bit lines that are electrically connected to the bit line contacts, and thus the drain select gates, and to produce other lines that are connected to contacts $386_1$ and $386_2$, and contact 388 (or contact 590 when applicable).

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments. It is manifestly intended that the embodiments be limited only by the following claims and equivalents thereof.

What is claimed is:

1. A method of forming a memory, the method comprising:
   forming a floating gate of a memory cell and a first portion of a control gate of a select gate substantially concurrently from a common first conductor;
   forming a dielectric over the floating gate of the memory cell and over the first portion of the control gate of the select gate;
   forming a control gate of the memory cell over the dielectric from a second conductor;
   after forming the control gate of the memory cell, forming a second portion of the control gate of the select gate over the dielectric from a third conductor so that the second portion of the control gate of the select gate passes through the dielectric and contacts the first portion of the control gate of the select gate; and
   forming a contact from the third conductor in contact with a source/drain region that is connected to the select gate substantially concurrently with forming the second portion of the control gate of the select gate from the third conductor.

2. The method of claim 1, further comprising:
   forming the second conductor over the dielectric formed over the first portion of the control gate of the select gate substantially concurrently with forming the control gate of the memory cell over the dielectric from the second conductor; and
   removing the second conductor formed over the first portion of the control gate of the select gate before forming the second portion of the control gate of the select gate.

3. The method of claim 1, wherein the second portion of the control gate that passes through the dielectric and contacts the first portion of the control gate of the select gate and the contact are respectively formed in openings formed in another dielectric formed over the first portion of the control gate of the select gate, over the memory cell and over the source/drain region.

4. The method of claim 1, wherein the select gate and the memory cell are formed on a first portion of the memory, and further comprising:

forming a first portion of a control gate of a transistor on a second portion of the memory from the common first conductor substantially concurrently with forming the floating gate of the memory cell and the first portion of the control gate of the select gate;
   forming the dielectric over the first portion of the control gate of the transistor substantially concurrently with forming the dielectric over the floating gate of the memory cell and over the first portion of the control gate of the select gate; and
   forming a second portion of the control gate of the transistor over the dielectric from the second conductor substantially concurrently with forming control gate of the memory cell over the dielectric so that the second portion of the control gate of the transistor passes through the dielectric and contacts the first portion of the control gate of the transistor.

5. The method of claim 4, further comprising:
   forming an opening through the dielectric that exposes a portion of the first portion of the control gate of the transistor before forming the second portion of the control gate of the transistor substantially concurrently with forming the control gate of the memory cell;
   wherein forming the second portion of the control gate of the transistor over the dielectric from the second conductor comprises forming a portion of the second conductor within the opening so that that portion of the second conductor contacts the exposed portion of the first portion of the control gate of the transistor.

6. The method of claim 1, wherein the select gate and the memory cell are formed on a first portion of the memory, and further comprising:
   forming a first portion of a control gate of a transistor on a second portion of the memory from the common first conductor substantially concurrently with forming the floating gate of the memory cell and the first portion of the control gate of the select gate;
   forming the dielectric over the first portion of the control gate of the transistor substantially concurrently with forming the dielectric over the floating gate of the memory cell and over the first portion of the control gate of the select gate; and
   after forming the control gate of the memory cell, substantially concurrently forming a second portion of the control gate of the transistor and the second portion of the control gate of the select gate over the dielectric from the third conductor so that the second portion of the control gate of the transistor passes through the dielectric and contacts the first portion of the control gate of the transistor.

7. The method of claim 1, further comprising forming another source/drain region that interconnects the select gate and the memory cell in series.

8. The method of claim 1, wherein the first and second conductors comprise doped polysilicon and the third conductor comprises metal.

9. A method of forming a memory, the method comprising:
   forming a first dielectric over a semiconductor;
   forming a first conductor over the first dielectric;
   forming a second dielectric over the first conductor;
   forming a second conductor over the second dielectric;
   removing a portion of the second conductor in a memory-cell portion of the memory while protecting another portion of the second conductor in the memory-cell portion and removing the second conductor in a select-gate portion of the memory substantially concurrently therewith, wherein the protected portion of the second conductor in the memory-cell portion forms a control gate of a memory cell in the memory-cell portion;

removing a portion of the second dielectric and a portion of the first conductor from the memory-cell portion while protecting the control gate of the memory cell and removing a portion of the second dielectric and a portion of the first conductor from the select-gate portion substantially concurrently therewith while protecting another portion of the first conductor within the select-gate portion, wherein remaining portions of the second dielectric, first conductor, and the first dielectric under the protected control gate of the memory cell respectively form an intergate dielectric, a floating gate, and a tunnel dielectric of the memory cell and wherein remaining portions of the first conductor and the first dielectric in the select-gate portion respectively form a portion of a control gate and a gate dielectric of a select gate in the select-gate portion;

forming a third dielectric over the memory-cell and select-gate portions; and forming a contact through the third dielectric from a third conductor in the select-gate portion so that the contact contacts the portion of the control gate of the select gate to form a second portion of the control gate of the select gate;

wherein the select gate is devoid of the second conductor.

10. The method of claim 9, further comprising forming an other contact through the third dielectric from the third conductor substantially concurrently with forming the contact that contacts the control gate of the select gate so that the other contact contacts a first source/drain region that is formed in the semiconductor and that is coupled to the select gate, wherein the select gate is coupled in series with the memory cell by a second source/drain region that is formed in the semiconductor.

11. The method of claim 9, further comprising:

before forming the second conductor, forming an opening through the second dielectric in a periphery of the memory to expose a portion of the first conductor in the periphery, wherein forming the second conductor over the second dielectric further comprises forming the second conductor in the opening in the periphery and in contact with the exposed portion of the first conductor;

removing a portion of the second conductor in the periphery substantially concurrently with removing the second conductor in the memory-cell and select-gate portions, wherein a remaining portion of the second conductor in the periphery that contacts the first conductor forms a first portion of a control gate of a transistor in the periphery; and removing a portion of the second dielectric and a portion of the first conductor, while protecting the first portion of control gate of the transistor, substantially concurrently with removing the portion of the second dielectric and the portion of the first conductor from the memory-cell and select-gate portions, wherein the remaining portions of the first conductor and the first dielectric respectively form a second portion of the control gate of the transistor in contact with the first portion of the control gate of the transistor and a gate dielectric of the transistor.

12. The method of claim 9, further comprising:

removing a portion of the second conductor in a periphery of the memory substantially concurrently with removing the portions of the second conductor in the memory-cell and select-gate portions;

while protecting a portion of the first conductor in the periphery, removing another portion of the second dielectric and a portion of the first conductor from the periphery, substantially concurrently with removing the portion of the second dielectric and the portion of the first conductor from the memory-cell and select-gate portions, wherein remaining portions of the first conductor and the first dielectric in the periphery respectively form a first portion of a control gate and a gate dielectric of a transistor in the periphery;

wherein forming the third dielectric over the memory-cell and source-select-gate portions further comprises forming the third dielectric over the periphery substantially concurrently therewith; and wherein forming a contact through the third dielectric in the select-gate portion further comprises substantially concurrently forming an other contact through the third dielectric in the periphery so that the other contact contacts the first portion of the control gate of the transistor to form a second portion of the control gate of the transistor.

* * * * *